United States Patent
Alfredsson et al.

(10) Patent No.: US 12,062,906 B2
(45) Date of Patent: Aug. 13, 2024

(54) MODULAR INTELLIGENT ELECTRONIC DEVICE (IED) WITH CONVECTION COOLING

(71) Applicant: HITACHI ENERGY LTD, Zurich (CH)

(72) Inventors: Fredrik Alfredsson, Västerås (SE); Jimmy Kjellsson, Västerås (SE); Ryan Mackenzie, Västerås (SE); Mårten Olsson, Eskilstuna (SE); Anders Döragrip, Västerås (SE)

(73) Assignee: Hitachi Energy Ltd., Zurich (CH)

( * ) Notice: Subject to any disclaimer, the term of this patent is extended or adjusted under 35 U.S.C. 154(b) by 501 days.

(21) Appl. No.: 17/285,337

(22) PCT Filed: Oct. 12, 2019

(86) PCT No.: PCT/EP2019/077673
§ 371 (c)(1),
(2) Date: Apr. 14, 2021

(87) PCT Pub. No.: WO2020/078862
PCT Pub. Date: Apr. 23, 2020

(65) Prior Publication Data
US 2021/0367420 A1    Nov. 25, 2021

(30) Foreign Application Priority Data
Oct. 15, 2018  (EP) ..................... 18200431

(51) Int. Cl.
*H05K 7/20*  (2006.01)
*H02H 7/26*  (2006.01)
*H05K 7/14*  (2006.01)

(52) U.S. Cl.
CPC .............. *H02H 7/26* (2013.01); *H05K 7/1424* (2013.01); *H05K 7/20163* (2013.01); *H05K 7/20563* (2013.01)

(58) Field of Classification Search
CPC .............. H05K 7/20163; H05K 7/1424; H05K 7/20563; H05K 7/20263; H02H 7/26
See application file for complete search history.

(56) References Cited

U.S. PATENT DOCUMENTS

| 4,327,835 A | 5/1982 | Leger |
| 5,859,764 A | 1/1999 | Davis et al. |

(Continued)

FOREIGN PATENT DOCUMENTS

| CN | 2559048 Y | * | 7/2003 |
| CN | 104350645 A | | 2/2015 |

(Continued)

OTHER PUBLICATIONS

ABB, "Line differential protection RED670 Installation and commissioning manual", Relion® 670 series, Document ID: 1MRK 505 224-UEN, Revision: C, Product version: 1.2, Dec. 31, 2012, 266 pages.

(Continued)

*Primary Examiner* — Harry R Behm
(74) *Attorney, Agent, or Firm* — Slater Matsil, LLP

(57) ABSTRACT

The present disclosure relates to an IED configured for use as a protection relay in an electric power system. The IED comprises a plurality of cassettes connected to a backplane, with at least two cassettes mounted adjacent each other. Each of the cassettes comprises a housing profile in the form of a rectangular tube having an envelope wall of a heat conducting material, and at least one electronic card arranged in a card slot within the tube formed by the housing profile, which at least one card is electrically connected to (Continued)

the backplane. Adjacent cassettes are separated a distance such that air canals are formed between their respective housing profiles.

20 Claims, 4 Drawing Sheets

(56) References Cited

U.S. PATENT DOCUMENTS

| | | | | |
|---|---|---|---|---|
| 6,229,704 | B1 * | 5/2001 | Hoss | G06F 1/20 |
| | | | | 361/689 |
| 6,678,159 | B1 | 1/2004 | Barcley | |
| 9,246,252 | B2 | 1/2016 | Kachlic et al. | |
| 10,694,637 | B1 * | 6/2020 | Wolf | H01Q 1/002 |
| 2002/0008964 | A1 * | 1/2002 | Hutchison | H05K 7/1424 |
| | | | | 361/714 |
| 2004/0085728 | A1 * | 5/2004 | Barth | H05K 7/20445 |
| | | | | 361/715 |
| 2010/0271794 | A1 * | 10/2010 | Gloor | H05K 7/1457 |
| | | | | 361/788 |
| 2010/0321890 | A1 | 12/2010 | Streyel et al. | |
| 2015/0055294 | A1 | 2/2015 | Sato | |
| 2017/0112024 | A1 * | 4/2017 | Sato | H05K 7/20563 |
| 2018/0042141 | A1 * | 2/2018 | Qu | H05K 7/20745 |

FOREIGN PATENT DOCUMENTS

| | | | | |
|---|---|---|---|---|
| DE | 10148470 | A1 | 4/2003 | |
| DE | 102009056274 | A1 * | 6/2011 | F28D 7/1692 |
| EP | 2244544 | A1 * | 10/2010 | H05K 7/1438 |
| EP | 3176672 | A1 | 6/2017 | |
| FR | 1275770 | A | 11/1961 | |
| GB | 2354062 | A | 3/2001 | |
| JP | H3-27777 | A | 5/1984 | |
| JP | H8-205556 | A | 8/1996 | |
| JP | H11262165 | A | 9/1999 | |
| JP | 2012531039 | A | 12/2012 | |
| KR | 20050120171 | A | 12/2005 | |

OTHER PUBLICATIONS

ABB Schweirz AG, "Notification of Transmittal of the International Search Report and the Written Opinion of the International Searching Authority, or the Declaration", PCT/EP2019/077673, Oct. 23, 2019, 15 pages.

* cited by examiner

MODULAR INTELLIGENT ELECTRONIC DEVICE (IED) WITH CONVECTION COOLING

CROSS-REFERENCE TO RELATED APPLICATIONS

This application is a national stage application of International Patent Application No. PCT/EP2019/077673, filed on Oct. 12, 2019, which claims priority to European Patent Application No. 18200431.7, filed on Oct. 15, 2018, all of which applications are hereby incorporated herein by reference.

TECHNICAL FIELD

The present disclosure relates to an Intelligent Electronic Device (IED), for example used as a protection relay in an electric power system.

BACKGROUND

So called Intelligent Electronic Devices (IEDs) are for example used as protection relays for power lines/stations, for preventing fault currents, e.g., resulting from a lightning strike, in a power line from damaging power system equipment, such as transformers. The IED contains a plurality of electronic cards (circuit boards) mounted in a housing. The IED may heat up and a cooling system is needed for preventing overheating of the cards. Conventionally, the cards are cooled by means of a fan circulating air through openings in the housing and past the cards for heat exchange.

A problem experienced with such IEDs is that vermin and polluted air can enter the housing and deposit dust and corrosive agents, or otherwise damage the cards, especially when the IED is in an uncontrolled environment, e.g., outdoors.

SUMMARY

It is an objective of an embodiment of the present invention to provide an IED with a cooling system with reduced risk of card damage due to dust and corrosive agents entering the housing of the cards.

It has been realized that the problem of dust and corrosive agents entering the housing can be handled by using a housing which is substantially sealed to its surroundings, or at least does not admit cooling air to flow there through. However, such a housing would also prevent necessary cooling of the electronic cards.

In accordance with an embodiment of the present invention, the cooling is handled by dividing the electronic cards of the IED into a plurality of modular cassettes wherein each cassette may be substantially sealed to its surroundings. The cassettes are connected to a backplane which is common to the cassettes in the IED. The cassettes are arranged a distance from each other such as to allow cooling air to flow between the cassettes, but substantially not into the cassettes. The cassette walls, at least those walls facing other cassettes within the IED, are of a heat conducting material, such as a metal, e.g., aluminum (Al). To further improve the heat exchange, the cards within the cassettes may be connected to the heat conducting walls via a respective heat sink, allowing heat formed in a card to be conducted to a heat conducting wall of the cassette via its heat sink, whereby the heat can be exchanged with the cooling air flowing between the cassettes.

Also cooling fans may be affected by dust and corrosive agents, which necessitate regular maintenance to ensure proper operation of the fans. Thus, it may be desirable to avoid the need for cooling fans in IEDs. Embodiments of the present invention facilitate convection flow of air between the cassettes, obviating the need for a cooling fan.

According to an aspect of the present invention, there is provided an IED comprising a plurality of cassettes connected to a backplane which is common to all of the plurality of cassettes. Each of the cassettes comprises a housing profile in the form of a rectangular tube having an envelope wall of a heat conducting material, a front opening and a back opening. Each of the cassettes also comprises at least one electronic card arranged in a card slot within the tube formed by the housing profile, which at least one card is electrically connected to the backplane. Adjacent cassettes are separated by a distance such that an air canal is formed between their respective housing profiles.

It is to be noted that any feature of any of the aspects may be applied to any other aspect, wherever appropriate. Likewise, any advantage of any of the aspects may apply to any of the other aspects. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

BRIEF DESCRIPTION OF THE DRAWINGS

Embodiments will be described, by way of example, with reference to the accompanying drawings, in which.

DETAILED DESCRIPTION OF ILLUSTRATIVE EMBODIMENTS

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art. Like numbers refer to like elements throughout the description.

Embodiments of the present invention relates to an IED. The IED may be configured for control of a power grid. The power grid may typically be a high-voltage grid, e.g., rated for at least 1000 V, but the power grid may alternatively be rated for medium or low voltage, e.g., in a distribution power grid or in industry. The IED may be configured for use as a protection relay in an electric power system, e.g., used for protecting electrical equipment connected to the power grid. Alternatively, the IED may be configured as a remote terminal unit, as a merging unit, and/or as a circuit breaker controller.

For example, the IED may act as a protection relay for electrical equipment, e.g., a transformer, by monitoring a voltage and/or current in a power line connected to the electrical equipment and, in case a fault current is detected, e.g., send a command to open a circuit breaker to clear the fault current. In some embodiments of the present invention, the electrical equipment comprises a transformer substation. Embodiments of the IED of the present disclosure may be particularly useful for protecting a transformer.

Figure 1:
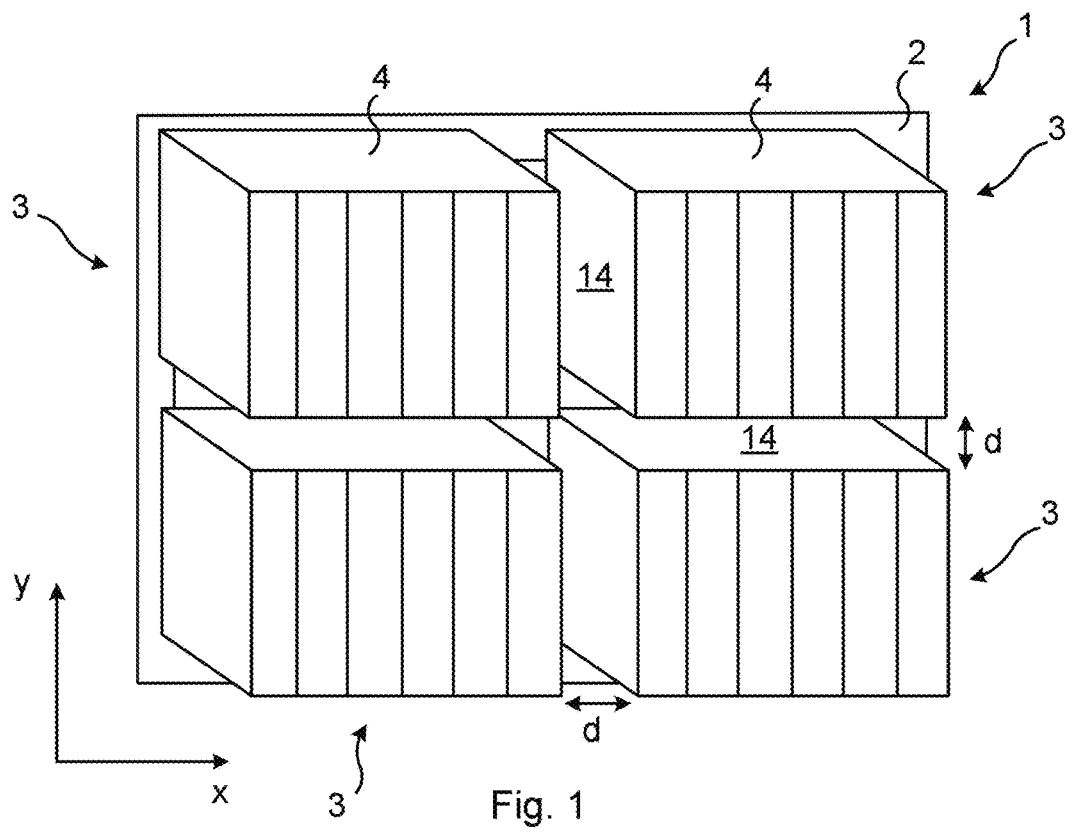
FIG. 1 is a schematic perspective back view of an IED having a matrix of 2×2 cassettes mounted to a frame, in accordance with an embodiment of the present invention.

FIG. 1 is a schematic perspective back view of an IED 1 having a matrix of 2×2 cassettes 3 mounted to a frame 2. The frame 2 may be optional e.g., if the backplane is rigid enough. The two-dimensional matrix is in a plane x, y as indicated in the figure. The cassettes are mounted to the frame such that adjacent cassettes are separated by a distance d such that air canals 14 are formed between the respective housing profiles 4 of the cassettes. The housing profile 4 is herein also called "housing" 4. The air canals allow cooling air to flow between the cassettes and in contact with the heat conducting material of the envelope walls of the respective cassette housing profiles, for heat transfer from the heat conducting material to the cooling air. The cooling air may preferably flow in the canals 14 by way of convection, obviating the need for cooling fan(s).

An IED 1 may comprise any number of cassettes 3 arranged in a one- or two-dimensional (x and y dimensions as in FIG. 1) matrix, e.g., a 1×2, 1×3, 2×2, 2×3, 3×2 or 3×3 matrix, preferably a two-dimensional matrix.

The cassettes 3 may be connected to a backplane 90 (see FIG. 7), which may be an active or passive backplane of the IED. Each of the electronic cards in the cassettes may be electrically connected to the backplane. The backplane may be arranged at the back openings 7, and may e.g., comprise the back side arrangement 11 (see FIG. 5) for each of the cassettes 3. Alternatively, the backplane may be arranged at the front openings 6 of the cassettes, e.g., as in the embodiment of FIG. 7. The backplane typically comprises electrical contacts arranged to connect with corresponding electrical contacts of the electronic cards 12 mounted in the cassettes 3.

Figure 2:
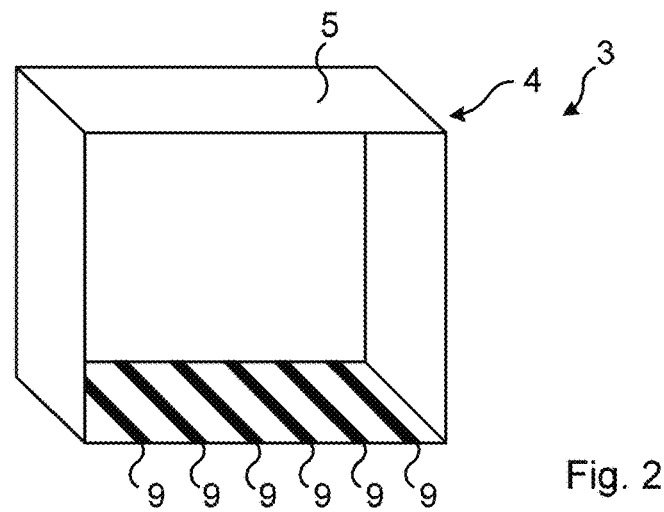
FIG. 2 is a schematic perspective back view of a cassette without a back side arrangement, showing card slots for electronic cards, in accordance with an embodiment of the present invention.

FIG. 2 is a schematic perspective back view of a cassette 3, without its back side arrangement 11, showing card slots 9 for electronic cards. The card slots may conveniently be integrated in or attached to an inside surface of the envelope wall 5 of the housing profile 4. In the embodiment of the figure, the number of slots 9 is six, which may be preferred in some embodiments. In other embodiments another number of slots may be preferred, e.g., eight slots for eight corresponding electronic cards 12. More generally, in some embodiments, the number of electronic cards 12, and thus slots 9, in each cassette 3 may be within the range of 2-12 cards, preferably 4-10 cards or 6-10 cards, e.g., 8 cards. The size of each cassette/housing is dependent on the number of slots it has, i.e., on the number of cards it is configured to hold. Typically, all cassettes 3 in an IED 1 are of the same size, but also cassettes of different sizes may be used, e.g., one size for twice as many cards as another size, as long as sufficient cooling canals 14 are formed there between.

By "envelope wall" is here intended the annular longitudinal wall forming the rectangular tube of the housing 4, excluding any transverse front or back side arrangement of the cassette 3. The envelope wall 5 is preferably arranged without ventilation holes, to prevent dirt and small animals from entering the cassette, e.g., preventing ambient air or dust from passing through the envelope wall and into the cassette 3/housing 4, i.e., the envelope wall is not provided with any holes which may allow air to pass there through. For instance, the envelope wall may be made in one continuous piece, or may be made from a plurality of parts, e.g., each corresponding to one, two or three sides of the rectangular tube, which may be assembled to form the envelope wall e.g., for easy mounting or removing of electronic cards in the cassette. The envelope wall 5 may e.g., be made by extrusion.

Figure 3:
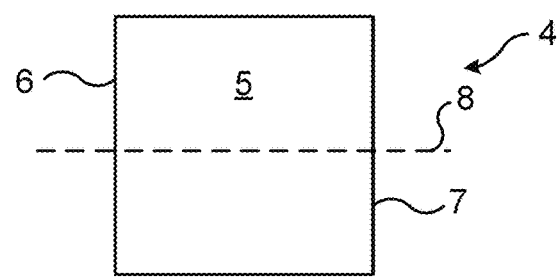
FIG. 3 is a schematic side view of a housing profile of a cassette, with front and back openings, as well as its longitudinal axis, indicated, in accordance with an embodiment of the present invention.

FIG. 3 is a schematic side view of a housing profile 4 of a cassette 3, with front and back openings 6 and 7, as well as the longitudinal axis 8 of the housing profile. The longitudinal axis 8 is, when the cassette is mounted to the frame 2 and/or the backplane 90, perpendicular to the plane x, y of the matrix of cassettes 3 in the IED 1. The front and back openings 6 and 7 are resulting from the rectangular tube form of the housing profile 4 by means of the envelope wall 5.

Figure 4:
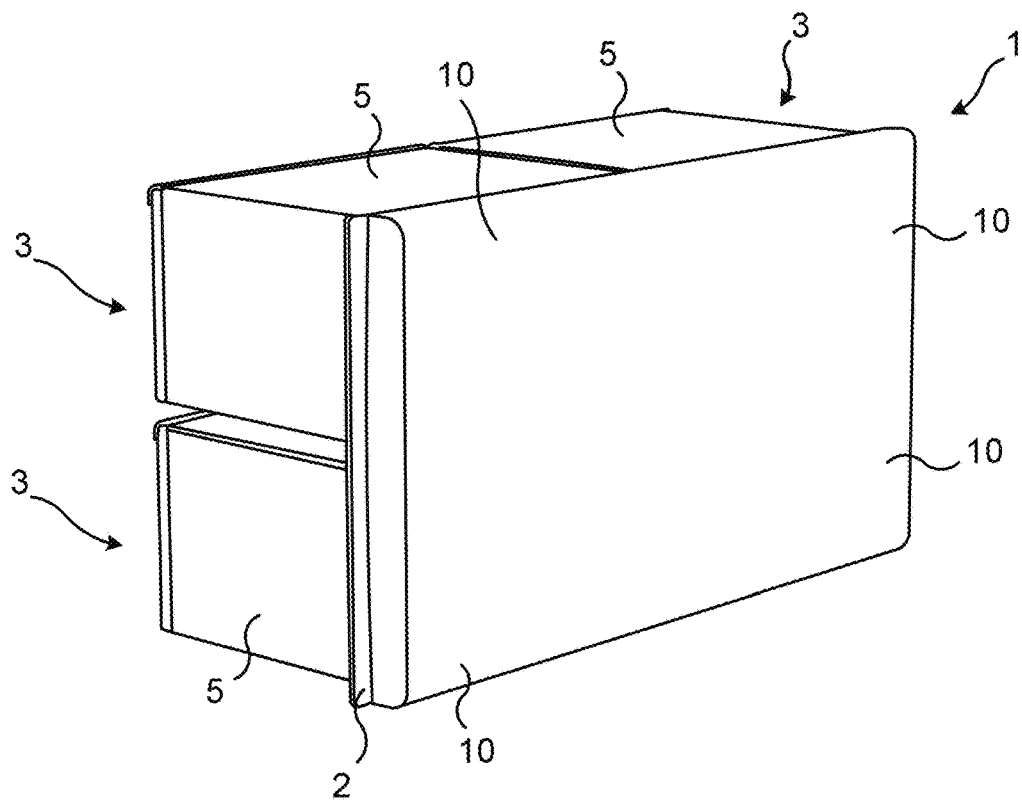
FIG. 4 is a schematic perspective front view of an IED having a front side arrangement and a matrix of 2×2 cassettes mounted to a frame, in accordance with an embodiment of the present invention.

FIG. 4 is a schematic perspective front view of an IED 1 having an optional front side arrangement 10, here comprising a front panel which is common to all cassettes and arranged to block the respective front opening 6 of each of the cassettes, and a matrix of 2×2 cassettes 3 mounted to a frame 2. The front side arrangement 10 is arranged to block the front opening 6 of the housing profile 4. The front side arrangement may e.g., be mounted to the frame 2 and/or to the envelope wall(s) 5 of the housing profile(s) of one or several adjacent cassettes 3. In the embodiment of FIG. 4, a front side arrangement 10 comprises a common front panel which covers four cassettes in a 2×2 matrix configuration, thus blocking the respective front openings of the housing profiles 4 and forming part of the respective front side arrangements 10 of the four cassettes. The front side arrangement 10 of a cassette prevents dust and corrosive agents from entering the housing 4 via its front opening 6. This does not necessarily imply that the front side arrangement hermetically seals against the envelope wall 5 of the cassette, though that may be preferred in some embodiments, but it may be sufficient for the front side arrangement to be more loosely fitted over or in the front opening 6 to effectively prevent, at least most of, cooling air or vermin to enter the housing. In some embodiments, the front side arrangement 10, e.g., in a front panel thereof, comprises a user interface, e.g., comprising a display, buttons or status lights. Alternatively, each cassette may comprise its own front panel, forming part of its front side arrangement, separate from the front panels of adjacent cassettes.

Figure 5:
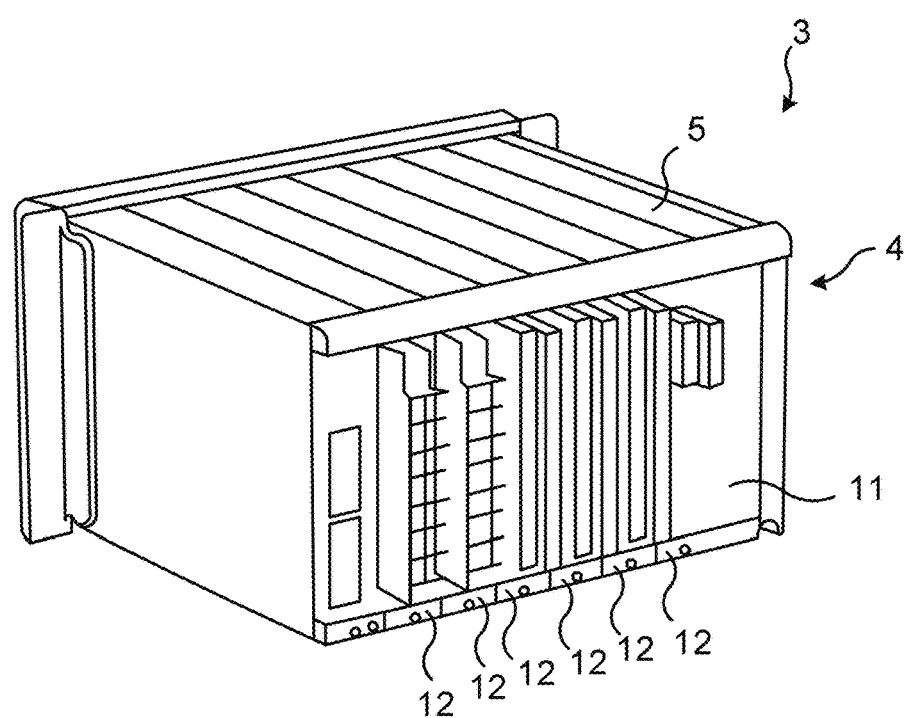
FIG. 5 is a schematic perspective back view of a cassette with a back side arrangement and electronic cards arranged therein, in accordance with an embodiment of the present invention.

Similarly, each cassette 3 may be provided with a back side arrangement 11, e.g., as shown in FIG. 5, e.g., comprised in or electrically connected to the backplane 90 to which each cassette is electrically connected. The back side arrangement 11 is arranged to block the back opening 7 of the housing profile 4.

By means of the optional front and back side arrangements 10 and 11, in cooperation with the envelope walls 5, each of the housings 4 may be substantially closed, preventing dust and/or other pollutants from entering the housing.

FIG. 5 is a schematic perspective back view of a cassette 3 with a back side arrangement 11 and electronic cards 12 arranged in the cassette. The back side arrangement 11 may be formed of back portions of the electronic cards 12 when they are fitted in a respective slot 9 within the housing profile 4, which fit together to form the back side arrangement 11, optionally together with other blocking sections of the back side arrangement, and thus blocking the back opening 7, e.g., to prevent dust and/or other pollutants from entering the cassette. Alternatively, the back side arrangement 11 of each cassette 3 in the IED may comprise, or be part of, a back panel, e.g., with similar properties as discussed above regarding a front panel of the front side arrangement 10.

Figure 6:
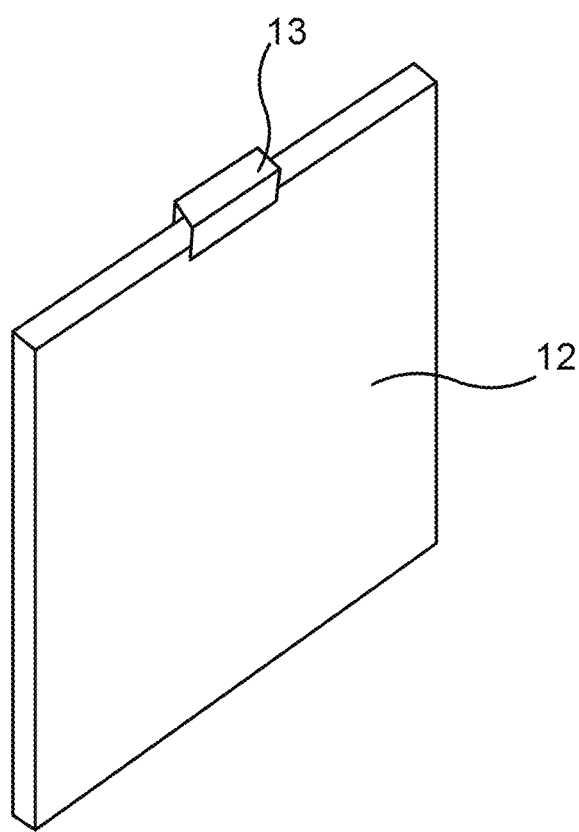
FIG. 6 is a schematic perspective side view of an electronic card with a heat sink, in accordance with an embodiment of the present invention.

FIG. 6 is a schematic perspective side view of an electronic card 12 with an optional heat sink 13 attached thereto. The heat sink 13 is arranged to conduct heat from the electronic card to the heat conductive material of the envelope wall 5 of the cassette 3 in which the card 12 is mounted in a slot 9. Much resistive heat may be generated in the electronic card 12 which needs to be exchanged with the cooling air flowing through the canals 14. For efficient transfer of the heat from the card 12 to the envelope wall 5 via the heat sink, the heat sink 13 may be arranged in contact with both the card and the envelope wall when the card is mounted in a slot 9 within the housing 4. When a plurality of cards 12 are arranged in slots 9 in the housing 4, one, some or each of the cards may be connected to the envelope wall of the housing via a respective heat sink 13, or all, or some of, the cards may be connected to the envelope wall of the housing profile via the same (common) heat sink. In some embodiments, all of the cassettes 3 of the IED 1 comprises at least one heat sink 13, but in some other embodiments only one or some (not all) of the cassettes comprises at least one heat sink 13.

The ability to effectively cool an IED 1 may be fundamental, especially when e.g., arranged outdoors in a warm and humid climate, which may be when the risk of corrosive agents entering the IED via air or vermin may be most pronounced.

Figure 7:
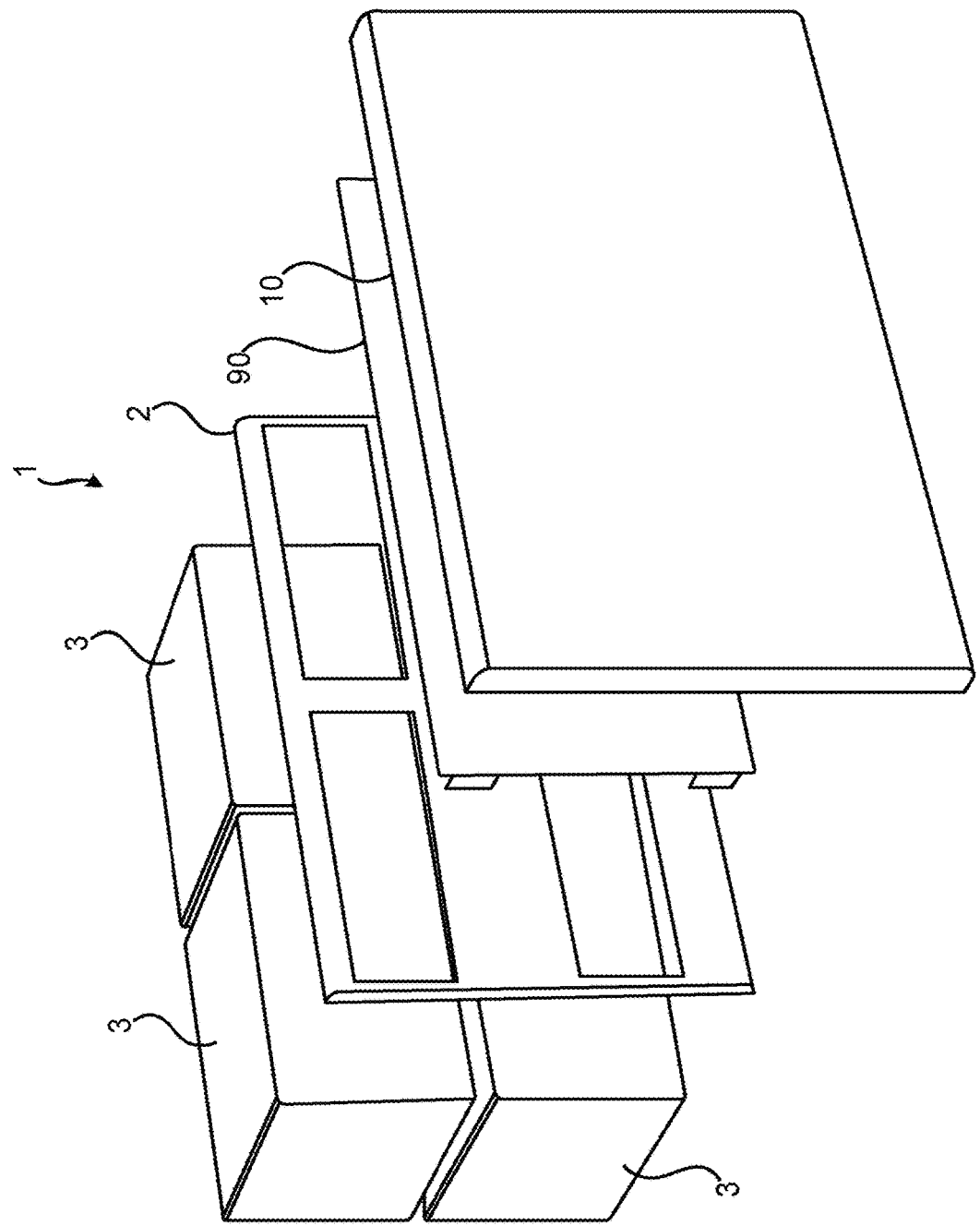
FIG. 7 is a schematic exploded view of an IED, in accordance with an embodiment of the present invention.

FIG. 7 is an exploded view of an embodiment of an IED 1. The IED comprises a backplane 90 which is common to all cassettes 3 of the IED. The backplane is provided with electrical contacts arranged to mate with corresponding electrical contacts of the electronic cards 12 mounted in the cassettes, thus electrically connecting the electronic cards to/via the backplane 90. In the embodiment of FIG. 7, the IED also comprises a frame 2 and a front panel. Further, in the embodiment of FIG. 7, the backplane 90 is arranged at the front openings 6 of the cassettes, between the frame 2 and the front panel, e.g., with the electrical contacts of the backplane connecting with the electrical contacts of the electronic cards through openings in the frame 2. In other embodiments of the present invention, the backplane 90 may be arranged in another way, either at the front openings 6 or at the back openings 7 of the cassettes.

In some embodiments of the present invention, the distance d is within the range of 5-30 mm, e.g., 8-15 mm. However, the distance d may be any suitable distance which allows convection flow of air between the cassettes for cooling thereof.

In some embodiments of the present invention, the at least one electronic card 12 consists of a number of electronic cards within the range of 2-12 cards, preferably 4-10 cards or 6-10 cards, e.g., 8 cards. For simplicity, it may be convenient to fit as many cards as possible per cassette, but fewer cards are preferable to reduce the heat generated per cassette, which leads to a trade-off when determining the number of cards per cassette. The card holders 9, and thus the cards 12 mounted therein, may e.g., be arranged at a distance from each other within the range of 10-30 mm, e.g., 15-25 mm.

In some embodiments of the present invention, the heat conducting material comprises or consists of a heat conducting metal, e.g., comprising any of aluminum (Al) and copper (Cu), which are useful conducting materials, but any suitable heat conducting material may be used, such as alloys comprising Ag, Al and/or Cu or other. In some embodiments, a heat conducting material consisting of Al is preferred. In some embodiments, the heat conducting material is extruded aluminum.

In some embodiments of the present invention, the IED 1 is mounted outdoors such that ambient rain and/or wind can directly engage outside surfaces of the respective envelope walls 5 of at least one of the cassettes 3 in the IED. Embodiments of the invention may be especially suitable for use in environments where it is undesirable with ventilation holes in the envelope walls due to the risk of pollutants entering the cassettes and compromising the cards therein.

In accordance with some other embodiments of the present invention, there is provided an IED 1 comprising a frame 2 and a plurality of cassettes 3 mounted to the frame, forming a two-dimensional matrix of cassettes. Each of the cassettes comprises a profile 4 in the form of a rectangular tube, a front side arrangement 10 arranged to block the front opening 6 of the housing profile tube, a back side arrangement 11 arranged to block the back opening 7 of the housing profile tube, at least one electronic card 12 arranged in a plane perpendicular to the plane x, y of the matrix within the tube formed by the housing profile, a heat sink 13 connecting the at least one electronic card to the profile such that heat can be conducted from the at least one card to the profile via the heat sink. Adjacent cassettes in the matrix are separated a distance d such that air canals 14 are formed between their respective profiles.

In accordance with some embodiments, there is provided an IED 1. The IED may be arranged for control of a power grid, e.g., for automation of a power grid. The power grid may typically be a high-voltage grid, e.g., rated for at least 1000 V, but the power grid may alternatively be rated for medium or low voltage, e.g., in a distribution power grid or in industry. The IED may be configured for use as a protection relay in an electric power system, e.g., used for protecting electrical equipment connected to the power grid. Alternatively, the IED may be configured as a remote terminal unit, as a merging unit, and/or as a circuit breaker controller. The IED comprises a plurality of cassettes 3 connected to a backplane 90, with at least two cassettes mounted adjacent each other. Each of the cassettes comprises a housing profile 4 in the form of a rectangular tube having an envelope wall 5 of a heat conducting material, and at least one electronic card 12 arranged in a card slot 9 within the tube formed by the housing profile, which at least one card is electrically connected to the backplane. Adjacent cassettes are separated by a distance d such that air canals 14 are formed between their respective housing profiles.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A fanless intelligent electronic device (IED) comprising:
   a backplane of the fanless IED, wherein the backplane is common to a plurality of cassettes; and
   the plurality of cassettes of the fanless IED, wherein the plurality of cassettes are connected to the backplane and form a matrix of cassettes with at least two cassettes mounted adjacent to each other in at least one dimension of two dimensions forming a plane of the matrix;
   wherein each of the cassettes comprises:
      a housing profile in a form of a rectangular tube having a single interior chamber, an envelope wall of a heat conducting material, a front opening, a back opening, and a longitudinal axis perpendicular to the plane of the matrix; and
      a plurality of electronic cards arranged in respective card slots within the single interior chamber of the rectangular tube formed by the housing profile, wherein the plurality of electronic cards are electrically connected to the backplane; and
   wherein adjacent cassettes in the matrix are separated by a distance such that at least one air canal is formed between respective housing profiles of the adjacent cassettes.

2. The IED of claim 1, further comprising a front panel that is common to the plurality of cassettes and arranged to block the front opening of each of the cassettes.

3. The IED of claim 1, wherein the housing profile of each cassette is arranged to prevent ambient air and/or dust from passing through the envelope wall.

4. The IED of claim 1, wherein the distance is within a range of 5-30 mm.

5. The IED of claim 1, wherein the distance is within a range of 8-15 mm.

6. The IED of claim 1, further comprising a frame to which the cassettes are mounted.

7. The IED of claim 1, wherein each of the cassettes comprises at least one heat sink connecting at least one of the electronic cards to the envelope wall providing a path for heat to be conducted from the at least one of the electronic cards to the envelope wall via the at least one heat sink.

8. The IED of claim 1, wherein the plurality of electronic cards consists of a number of electronic cards within a range of 2-12 cards.

9. The IED of claim 1, wherein the plurality of electronic cards consists of a number of electronic cards within a range of 6-10 cards.

10. The IED of claim 1, wherein the heat conducting material comprises or consists essentially of aluminum or copper.

11. The IED of claim 10, wherein the heat conducting material is extruded aluminum.

12. The IED of claim 1, wherein the plurality of electronic cards consists of a number of electronic cards within a range of 4-10 cards.

13. The IED of claim 1, wherein each of the cassettes has a back side arrangement arranged to block the back opening of the respective cassette.

14. An electrical power system comprising:
   an electrical power line;
   an electrical equipment connected to the electrical power line; and
   a fanless intelligent electronic device (IED) arranged as a protection relay to protect the electrical equipment from a fault current in the electrical power line, the IED comprising:
      a backplane of the fanless IED, wherein the backplane is common to a plurality of cassettes; and
      the plurality of cassettes of the fanless IED, wherein the plurality of cassettes are connected to the backplane and form a matrix of cassettes with at least two cassettes mounted adjacent to each other in at least one dimension of two dimensions forming a plane of the matrix;
      wherein each of the cassettes comprises:
         a housing profile in a form of a rectangular tube having a single interior chamber, an envelope wall of a heat conducting material, a front opening, a back opening, and a longitudinal axis perpendicular to the plane of the matrix; and
         a plurality of electronic cards arranged in respective card slots within the single interior chamber of the rectangular tube formed by the housing profile, wherein the plurality of electronic cards are electrically connected to the backplane; and
      wherein adjacent cassettes in the matrix are separated by a distance such that at least one air canal is formed between respective housing profiles of the adjacent cassettes.

15. The electrical power system of claim 14, wherein the electrical power line is rated for a voltage of at least 1000 volts.

16. The electrical power system of claim 14, further comprising a front panel that is common to the plurality of cassettes and arranged to block the front opening of each of the cassettes.

17. The electrical power system of claim 14, wherein each of the cassettes has a back side arrangement arranged to block the back opening of the respective cassette.

18. The electrical power system of claim 14, wherein the distance is within a range of 5-30 mm.

19. The electrical power system of claim 14, wherein each of the cassettes comprises at least one heat sink connecting at least one of the electronic cards to the envelope wall providing a path for heat to be conducted from the at least one of the electronic cards to the envelope wall via the at least one heat sink.

20. The electrical power system of claim 14, wherein the plurality of electronic cards consists of a number of electronic cards within a range of 2-12 cards.

* * * * *